United States Patent [19]
Kuehnle

[11] 4,013,539
[45] Mar. 22, 1977

[54] THIN FILM DEPOSITION APPARATUS

[75] Inventor: Manfred R. Kuehnle, Lexington, Mass.

[73] Assignee: Coulter Information Systems, Inc., Bedford, Mass.

[22] Filed: Nov. 1, 1974

[21] Appl. No.: 519,781

Related U.S. Application Data

[62] Division of Ser. No. 323,133, Jan. 12, 1973, Pat. No. 3,884,787.

[52] U.S. Cl. ............................ 204/298; 118/49.1; 118/2; 432/236
[51] Int. Cl.² .......................................... C23C 15/00
[58] Field of Search ............ 118/48, 49, 49.1, 49.5; 204/192, 298; 427/177–179, 35–44, 248–251; 432/236

[56] References Cited

UNITED STATES PATENTS

| | | | |
|---|---|---|---|
| 3,272,175 | 9/1966 | Lorenz et al. | 118/49 |
| 3,284,892 | 11/1966 | Wade | 427/178 X |
| 3,330,752 | 7/1967 | Hallen et al. | 118/49.5 X |
| 3,488,617 | 1/1970 | Dietrich et al. | 118/49 X |
| 3,528,902 | 9/1970 | Wasa et al. | 204/192 |
| 3,598,639 | 8/1971 | Hansson et al. | 118/420 X |
| 3,600,122 | 8/1971 | Coleman | 427/40 X |
| 3,630,872 | 12/1971 | Reichelt | 204/298 X |
| 3,650,737 | 3/1972 | Maissel et al. | 204/192 X |

FOREIGN PATENTS OR APPLICATIONS

| | | | |
|---|---|---|---|
| 7,844 | 3/1970 | Japan | 118/49 |
| 789,345 | 1/1958 | United Kingdom | 118/49.5 |

*Primary Examiner*—Morris Kaplan
*Attorney, Agent, or Firm*—Silverman & Cass, Ltd.

[57] ABSTRACT

A method and apparatus for the deposition of a thin film on a substrate in which a length of the substrate such as for example, flexible plastic film, is transported in a path which follows along a convoluted configuration through a pressure vessel and therein is subjected to deposition effects. Such deposition effects, for example, comprise high frequency sputtering plasma. The helical path is arranged so that the substrate is carried through the influence of the deposition effects a plurality of times and at speeds which are much greater than those of known methods and apparatus. As a result, the deposition of the thin film is more uniform and a high throughput is achieved. Many other advantages are also achieved. In addition to conventional types of cooling, efficient cooling is obtained by magnetically sweeping secondary electrons away from the substrate. Batch and continuous processing are disclosed.

36 Claims, 9 Drawing Figures

THIN FILM DEPOSITION APPARATUS

CROSS-REFERENCES TO RELATED APPLICATIONS

This is a division of application Ser. No. 323,133 filed Jan. 12, 1973 and now U.S. Pat. No. 3,884,787.

Reference will be made herein to two patent applications filed by the applicant and assigned to the same assignee as the assignee of this application.

One application is Ser. No. 260,848 filed June 8, 1972, now abandoned, and entitled "ELECTROPHOTOGRAPHIC FILM."

The second patent application Ser. No. 322,968 filed concurrently herewith on, now U.S. Pat. No. 3,829,373 and entitled "THIN FILM DEPOSITION APPARATUS USING RADIALLY CONVERGING PLASMA."

BACKGROUND OF THE INVENTION

The invention herein relates to the coating of substrates such as flexible plastic film which primarily is arranged in lengths by moving the substrate through a vessel in which some type of coating is applied, primarily by plasma vapor techniques.

Many structures in use today comprise thin members which have been uniformly coated with one or more substances whose characteristics and properties differ substantially from those of the members. The member receiving the coating is usually called a substrate and the coating is applied by one of several different techniques. Such structures include photographic film and paper, optical articles, other photosensitive structures, decorative objects and the like. The techniques by which the coatings are applied include vacuum deposition and plasma vapor techniques, these latter two techniques taking place inside of hermetic vessels whose atmospheres have been altered, by pumping down to achieve vacuum, by introducing atmospheres of different types of gases, etc.

For the purposes of the discussion and description which follow, several definitions should be kept in mind. The expression "thin film" as used herein is intended to mean a layer of some substance such as a semiconductor or ohmic material applied to a surface. Such a thin film layer is one which has a thickness that is measured in several thousands of Angstroms, such as for example 5000 A or 0.5 micron. The techniques and apparatus to be discussed make it feasible to deposit thin film layers whose thicknesses can be measured in even smaller fractions of microns.

Another expression which will be used is "photographic film." This means a complete article which includes a base of some plastic material such as sheeting, carrying an emulsion coating or the like. The article which is produced by the methods and apparatus of the invention can be considered a photographic or electrophotographic film which comprises a plastic sheet having one or more thin films deposited thereon.

The word "film" with its generic meaning as a thin coating or thin article without a modifying adjective will not be used herein in order to avoid confusion. While the substrate which is coated with thin film according to the method and apparatus of the invention may be called a film of plastic, since it is preferably of the order of 0.125 millimeters, it will be referred to herein only as a substrate. Reference has been made previously to a "flexible plastic film" for the purpose of giving an example of the type of substrate which is intended for use with the invention. No limitations are intended by the expression which has only been used for introduction purposes.

The invention herein is primarily concerned with the coating of thin flexible substrates arranged in strips or elongate members in an atmosphere of some inert gas such as argon using a thermal phenomenon which is known as plasma vapor deposition. While the technique may use nonelectrical apparatus, it is preferred that the plasma be created electrically. The method is commonly known as sputtering.

Reference made herein to "plasma" will mean an ionized gas created in a d.c. or radio-frequency a.c. field for the purpose of sputtering atoms from a target onto a substrate. The word "vapor" as used herein will mean a cloud of atomic particles created in a low pressure atmosphere by means of thermal evaporation or an electron gun, the vapor condensing on the surface of the substrate. Accordingly, "plasma vapor" means the cloud of particles created by sputtering or evaporation.

In the sputtering technique, a hermetic vessel is evacuated and then filled with an inert noble gas such as argon. The vessel is equipped with a cathode or target made of the material to be deposited and a substrate holder between which a high voltage a.c. or d.c. electrical field is established. The vessel may be made of stainless steel or heat resistant glass so as not to react with the sputtered material or the substrate. The target usually consists of a disc carefully brazed or otherwise bonded to a target holder which is cooled by a suitable coolant such as water to maintain a constant temperature. Various means are used to control temperature. Further features of the usual apparatus include high voltage conduits to bring either a.c. or d.c. power to the target from sources on the exterior of the vessel. The voltages fall typically in the kilovolt range. The substrate holder is in juxtaposition to the target and is also cooled to maintain its own temperature which may differ from the cathode or target temperature. This holder will usually have its own electrical connections but also will normally provide for the adjustment of the space between the target and the substrate to compensate for the gradual thinning of the target or to vary the deposition rate as a function of distance.

Since the electrical field may be either d.c. or a.c., the coating of either single or composite materials is capable of being achieved. D.c. sputtering is normally used for single conductive material targets whereas the deposition of composite materials which may consist of three or four elements necessitates a.c. sputtering at radio frequencies.

If the vapor pressures of the individual elements in a composite target are substantially different, then the element with the highest vapor pressure can be introduced in gaseous form. This technique will result in a reaction of the atoms flying from the target toward the substrate with the introduced gas during the flight, thus depositing a stoichiometrically accurate compound as the surface coating. This method is called reactive sputtering.

The presence of the high voltage electric field ionizes the inert gas thereby producing ions of a type which knock atoms from the target in addition to heat-producing secondary ions which have no practical value. The atoms knocked from the target are driven to the substrate and deposited. The process involves multiple collisions and complex physical effects but the net result is the depositing of the metal or other substance which comprises the target upon the substrate. Cooling means are used to offset the effect of the secondary electrons.

In vacuum depositing, a cloud of atoms is created thermally or by means of an electron gun within the pressure vessel under vacuum and the cloud condenses upon anything in the vessel including the exposed surface of the substrate. Cooling means normally are used to keep the substrate temperature within limits which retain its stability.

The invention herein will be discussed in connection with a method of and apparatus for sputtering, but no limitations are intended thereby. Important aspects of the invention are applicable to techniques for thin film deposition by methods in addition to sputtering.

Devices known in the prior art for the coating of substrates according to the general technique referred to are of two general configurations:
1. A vessel which may contain one or several substrate samples arranged in such a fashion as to facilitate batch coating; and
2. A vessel characterized by an entrance and an exit port through which a length of substrate moves in a continuous fashion.

The first of these structures and techniques uses a vessel which represents a closed chamber in which the conditions for plasma vapor deposition have to be reestablished each time that a new batch of substrates is loaded into the vessel.

The second case enables plasma vapor depositing conditions to be maintained as the substrate band moves through the vessel. In order to achieve the usually desired high degree of uniformity it is necessary, however, to monitor the deposition rates and temperature gradients along the path of the substrate movement. This information is needed in attempts to control such rates and gradients in order to compensate for variations in the deposition rate and morphological structure of the coatings which would vary continuously since the substrate passes the cathode or target area only once.

In prior continuous coating apparatus, besides the problems raised by the fact that the substrate passes the target area only once, other problems arise which produce nonuniformity in the thin film being deposited. One of the causes of such problems is mechanical variation in the distance between the substrate and the target and the other is shifting of the plasma envelope. The variation of distance between substrate and target can be caused by inability to maintain the substrate perfectly flat while it is in the plasma as for instance where it passes over wheels or drums which are not perfectly concentric. Substrate which is delicate and flexible will buckle and bubble. The shifting of the plasma envelope could be due to shifting of the current densities along the path of the substrate as it moves through the vessel. The uneven consumption of the target material is a common reason for this since the current will seek the paths of least resistance in the plasma between the target and the substrate support.

It is obvious that the optical properties of a photographic film for example will be unpredictable unless absolute uniformity can be maintained. In the case of an article which uses a photoelectrically responsive thin film or one which is to be used in microelectric circuitry, variations in the thickness of the deposit can render the article practically useless.

In addition to the above problems, a change in temperature of the entire pressure vessel or of a localized area of the substrate will cause major problems affecting both the local deposition rate and the morphological structure in that area. For example, one may have an amorphous deposit of materials in a one inch diameter region surrounded by sizable crystals which grow in those areas where the substrate was inadequately cooled. Buckling or bulges in the substrate could cause this also.

The throughput rate in a plasma vapor deposition apparatus is dictated by the size of the target, the deposition rate and the required thickness build-up which in turn determines the velocity or exposure time of the substrate. In the prior art targets of enormous length are being utilized in some instances to subject the substrate member to a long exposure time while it travels along the target. This method is primarily used in depositing thin films on long ribbons of substrate materials as in the manufacture of capacitors. Metal foils are deposited on plastic ribbon substrate. The technique is faulty because of extreme difficulty in maintaining uniformity in the characteristics mentioned - yet the object of the long target is to enable sufficient coating in one pass of the substrate member through the vessel. The throughput rate is nevertheless slow. Increasing the throughput rate decreases the uniformity and also because of a deposition rate established by current densities results in thinner coatings. For example, a target which operates at a deposition rate of 10A of a given material per second per square inch will deposit 20A per square inch if exposed two seconds. A speed-up of the travel velocity of the substrate member causes a reduction of the exposure time and hence results in a thinner coating. Half a second will provide only 5A per square inch of total thickness deposited.

The method and structures of the invention were developed for a purpose for which techniques and structure of the prior art were deficient. The film which is contemplated to be manufactured by the invention is described in some detail in the first said copending application, Ser. No. 260,848 entitled "ELECTROPHOTOGRAPHIC FILM." The invention herein is not limited to this purpose, however, but has a wide application in the art generally — being especially useful where great uniformity in thickness and stoichiometry is required in a coated substrate which is to be made in large quantities at great economy.

The electrophotographic film described in the above-identified first mentioned application utilizes a photoelectrically sensitive coating which is intended to be charged in darkness, then exposed to a light image at high speed, then treated with a toner to fix the light image with which it is exposed. The electrical characteristics of the film such as its electronic gain and conductivity are exponentially related to the inherent thickness of the coating and its variations. In other words, normally attainable thickness tolerance will not suffice to meet the speed and conductivity criteria of the electrophotographic film.

The invention herein provides methods and structure for obviating the problems which have been inherent in the prior art methods and apparatus.

SUMMARY OF THE INVENTION

Basically the invention comprises a method and structure for passing an elongate substrate member on a tortuous path repeatedly through a plasma vapor.

According to a preferred form of the invention, an elongate substrate member is passed through a plasma vapor established between target means and a drum. The substrate member is flexible and is enwrapped around the drum in a convoluted configuration of a plurality of turns so that in the process of rotating the drum the substrate member will be advanced at a rapid rate along the path established configuration. This carries the exposed surface of the elongate member through the plasma a plurality of times thereby enabling the receiving surface to be subjected to the plasma a substantial length of time in a short space (the axial length of the drum) and to be exposed to the plasma a plurality of times. As a result, the thin film deposited is of great uniformity and can readily be controlled as to thickness.

The apparatus of the invention advantageously uses the teachings of said U.S. Pat. No. 3,829,373.

The apparatus of the invention contemplates that there will be a supply of the substrate in strip form either inside of a pressure vessel or externally thereof passing through a suitable pressure lock and extending to the leading end of the rotating drum. After passing in a convoluted path while moving axially along the surface of the drum the substrate member is accumulated on a suitable take-up device inside of the vessel or on the exterior thereof, again passing through a suitable pressure lock if necessary.

The arrangement is such that the substrate member is tightly enwrapped around the outer surface of the drum so that even though it may be delicate and highly flexible, it is held in perfect rigidity on the surface of the drum with no buckling or bulging. The rear surface of the substrate member is protected against being coated.

In addition to cooling by coolant circulation, the secondary ions which cause heating of the substrate are removed by the establishment of a magnetic field in the pressure vessel. Means are provided to cause transmission of heat efficiently through the substrate and drum to cooling means built into the drum.

Electron charge on the surface of the thin film being deposited is leaked off the substrate surface by novel means.

Many other features of the invention will be detailed hereinafter.

BRIEF DESCRIPTION OF THE DRAWINGS

FIG. 5 is a fragmentary sectional view on an exaggerated scale taken through the periphery of the drum of apparatus constructed in accordance with the invention, generally along the line 5—5 of FIG. 3 and in the indicated direction;

DESCRIPTION OF THE PREFERRED EMBODIMENTS

The invention generally comprises a method for thin film deposition and apparatus for carrying out the method. An important aspect of the invention is concerned with the tortuous transportation of an elongate substrate member through a pressure vessel having a plasma vapor established therein, preferably through the use of electric fields. The substrate member is moved in a convoluted path in engagement with the surface of a drum that is rotated within the vessel. A supply of the uncoated substrate provides the input of the drum. The output from the drum, comprising the coated substrate is paid off from the drum and taken up by suitable means. In moving along the surface of the drum, the surface of the substrate member is exposed repeatedly to the plasma and is uniformly coated with a thin film of the metal or chemicals of which the target is formed. A high voltage field between the target and the drum provides the plasma and a magnetic field drives the secondary electrons out of the plasma to keep the substrate cool. The target and drum are electrically tuned to the field in case radio frequency is used.

The above is only a short indication of the nature of the invention, the details being set forth hereinafter by way of several embodiments emphasizing the preferred manner of practice of the methods and construction of the apparatus. The invention of said U.S. Pat. No. 3,829,373 is advantageously used herein.

Figure 1:
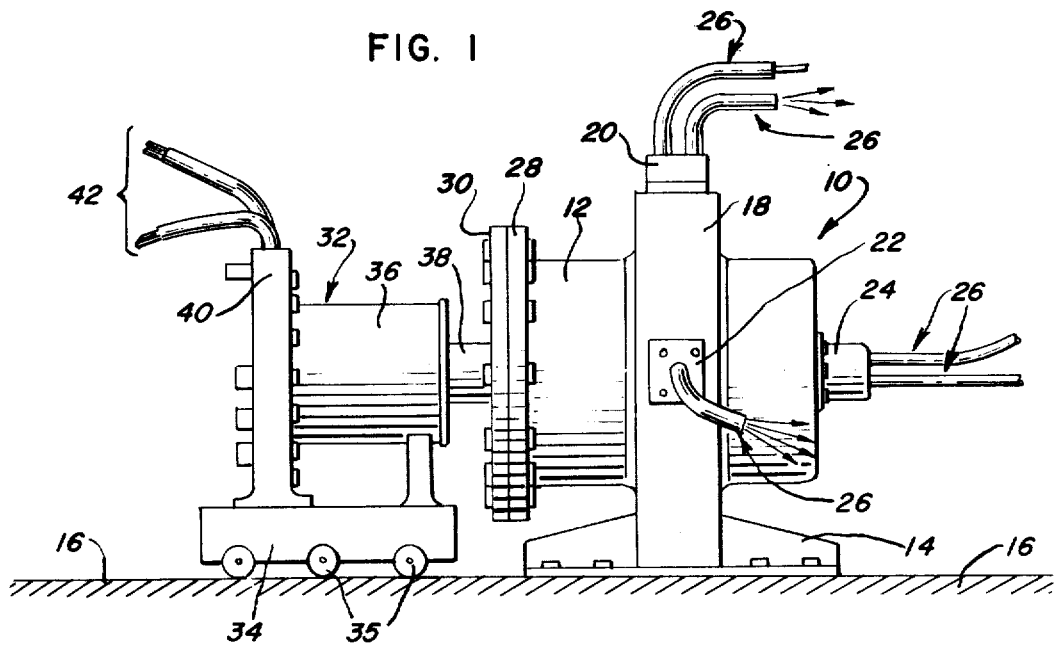
FIG. 1 is a diagrammatic side elevational view of apparatus which is constructed in accordance with the invention and in which the manner of practicing the invention is concerned with a batch process for depositing thin film on an elongate substrate member.

In FIG. 1 there is illustrated very crudely a diagram of a form of apparatus for the batch coating of elongate substrate members. This structure could be, for example, that which is illustrated and described in connection with FIGS. 3 and 4 or 7 and 8, but is not limited to such structure.

The apparatus for depositing thin film which is illustrated in FIG. 1 is designated generally by the reference character 10. There is a pressure vessel 12 suitably supported on a base 14 that is secured to a floor 16. Various mechanical, electrical and liquid connections are made to the interior of the vessel 12, these being for purposes which will be described. In order to indicate the existence of such connections, shown is a mechanical housing or collar 18 which engages around the center of the vessel 12 to provide support and to protect the various connections. Some diagrammatic representations of connections are shown emerging from junction housings 20 and 22 connected to the collar 18 and a junction housing 24 on the end of the vessel 12. Conduits, pipes or cables for the various connections to the interior of the vessel 12 are designated generally by the reference character 26.

The vessel 12 can be made of any inert material having a configuration and construction capable of withstanding high negative internal pressure. This material could be stainless steel, heat-resistant glass, or other substances.

The apparatus 10, as shown in FIG. 1, is intended primarily for coating of the substrate members in batch processes. Accordingly, a supply of the substrate and means for taking up the coated substrate are both provided on the interior of the vessel 12. The vessel is required to be opened from time to time in order to remove processed substrate and to furnish uncoated substrate to the supply. The left-hand end of the vessel 12, as shown in FIG. 1, is provided with a flange 28 that cooperates with a removable closure 30 to form a pressure-tight seal. Any rapid disassembly means may be used to hold the flanges tightly together.

As will be seen from the description, the invention contemplates the provision of a rotary drum which normally would be driven from the exterior of the vessel 12. The structure shown at 32 comprises a carriage 34 mounted on rollers 35 engaging the floor 16 so that the entire carriage may be moved left and right. A motor 36 connected with the drum (not shown in FIG. 1) is mounted on the carriage 34 and is coupled to the drum through a hollow shaft (not shown in FIG. 1) that passes through a connecting housing 38. The housing 38 is secured to the closure 30 and likewise carries conduits, electrical connections, control wires, etc. When the closure 30 has been disconnected from the flange 28, the entire closure 30, housing 38, interior drum, and associated apparatus may be moved to the left, the drum moving out of the vessel 12.

The stand or support 40 may include control instruments and panels. Shown at 42 are symbolic electrical connections which will be passed through the housing 38 to the drum or elsewhere on the interior of the housing 12.

In FIG. 1 as well as in other figures various connections and conduits are shown emerging from the pressure vessel such as 12 laterally or radially. This would include electrical wires, coolant tubes, mechanical connections for target adjustment, measurement instrument connections and couplings, etc. The illustrations made herein are simplified by such showings, it usually being preferred that all connections and conduits be carried through and supported by the closure 30 or its equivalent in the other figures. In this way, whenever desired, the entire closure can be removed and carry the major interior structure out into the open with it, enabling adjustments, replacement of targets, splicing of substrate lengths to the supply reels, etc. This should be kept in mind in considering the various structures hereinafter described.

Figure 2:
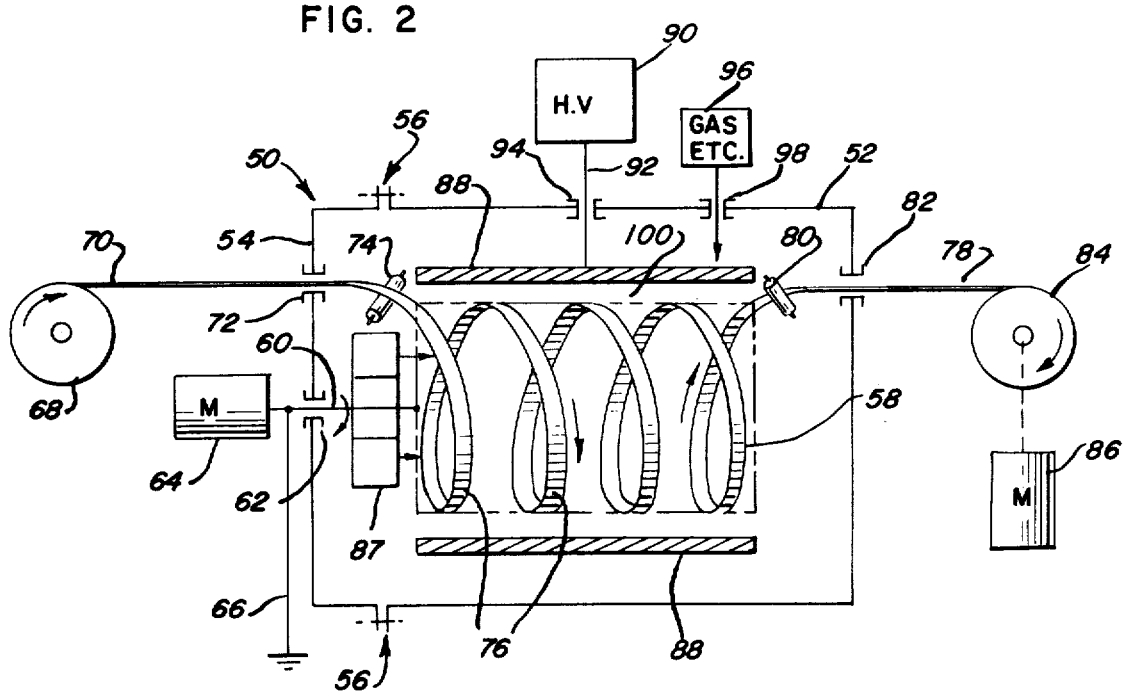
FIG. 2 is a highly simplified diagrammatic sectional view illustrating apparatus adapted for the continuous deposition of a thin film on an elongate substrate member.

FIG. 2 is a simplified diagram of a continuous processing apparatus 50 which utilizes the method of the invention and illustrates the type of apparatus which is used to carry out the method. In this case, there is a vessel 52 which is suitably constructed to withstand substantial internal negative pressure. The walls of the vessel may be made of stainless steel or heat-resistant glass or the like. The left end of the vessel is open and is provided with a closure 54 that is the equivalent of the closure 30 of FIG. 1. The flange connection 56 is the equivalent of the flange connection 28 and fastening means to enable rapid disassembly. In this case, however, since the process which is intended to be used with the apparatus 50 is continuous it will not be necessary to disassemble the closure 54 from the vessel 52 often. This is an advantageous arrangement since the plasma vapor condition on the interior of the vessel 52 does not have to be extinguished and renewed each time that a new batch of substrate is to be coated as is the case with the apparatus 10.

In FIG. 2 a cylindrical drum is illustrated at 58 by means of dashed lines, the drum being connected to a shaft 60 that passes through the closure 54 by way of a pressure-tight structure which is illustrated by the symbol 62. For purposes of clarity, the details of the structure 62 are not given, there being many different forms of such structure. The principal requirement of pressure-tight passageways extending through the wall of the vessel 52 or the closure 54 is that the gradient is pressure between the inside and outside be maintained. Likewise, there are requirements for electrical insulation, retention of gas, fluid and the provision for a mechanical member to be rotated or passed through the wall. The symbol shown at 62 in FIG. 2 will be utilized in the same or slightly differing form throughout the several figures of the drawings.

The passageway 62 of FIG. 2 is required to permit rotation of the shaft 60 from the exterior of the vessel 52 by means of the motor 64 and may also be required to carry electrical wires, coolant conduits and the like through the interior of the shaft 60 which preferably is hollow. Symbolically, the lead 66 to ground represents one type of electrical conductor which passes through the passageway 62, albeit internally of the shaft 60.

Shown in FIG. 2 at the left is a reel 68 representing a source of an elongate substrate member 70 which is to be coated within the vessel 52. The substrate member 70 may have a width of 35 millimeters and a thickness of a fraction of a millimeter. The edges may be perforated as in the case of conventional 35 millimeter photographic film. Likewise, the substrate 70 may be premasked so that when coated there will be automatically formed suitable frames along the length of the substrate member 70. The edges may also be masked by aluminizing. This provides a reliable electrical connection for handling substrate which is to be used in electrophotographic techniques as taught in said first-mentioned copending application Ser. No. 260,848. The actual material from which the substrate member 70 is made can be any suitable sheet plastic that will be stable during the conditions prevailing on the interior of the vessel 52 and during the process to which the substrate 70 in its completed form will be subjected when it is exposed, developed, etc. In the said first-mentioned copending application Ser. No. 260,848, the substrate comprises an electrically insulating material such as organic polymer. An example is flexible polyester.

The substrate member 70 passes through a pressure-tight passageway 72 also formed in the closure 54 to the interior of the vessel 52 and is guided, as for example, by roller means 74 to engage upon the cylindrical surface of the drum 58. For purposes of explanation, the substrate is shown lying on the surface of the drum 58 in four open loops 76, the configuration being helical so that the substrate member passes onto the drum 58 on the left and passes off the surface of the drum 58 on the right. This is a tortuous path of convoluted type, specifically helical. Passage of the now-coated substrate member 78 is guided by roller means 80 to pass through another pressure-tight passageway 82 in the end wall of the vessel 52 to a pickup device such as a reel 84 driven by a motor 86. Obviously, the source 68 and the take-up device 84 can be parts of a continuous production line extending over a much greater space than shown with suitable guiding and other processing means.

It is preferred that the loops 76 not be open as shown but be engaged one alongside of the other so that the number of turns of a given substrate member upon a drum will be quite substantial. In this way, the substrate member 70 will be repeatedly subjected to the plasma vapor established within the vessel 52.

The substrate member 70 passes along the outer surface of the drum 58 in a convoluted path which in the case of the apparatus 50 of FIG. 2 is helical. In addition to the rotary movement of the loops 76 which is effected by the rotation of the drum 58, there is an axial movement, in this case from left to right. Thus, the substrate member 70 must be pushed to the right or otherwise axially moved simultaneously while it is rotating. There are vairous means to accomplish this, as for example, structures used in the wire and yarn winding art. Reference may be made to the following patents for this type of structure: U.S. Pat. Nos. 2,681,140; 2,628,407; 2,447,143; 2,289,390; 1,920,224; German Auslegeschrift No. 1,191,197 published Apr. 15, 1965. Another technique and structure for moving the loops 76 involves applying motion by means of external belts somewhat in the manner that is used in winding paper on fixed mandrels in the manufacture of tubing.

A sliding or periodic shifting of the loops along the surface of the drum is required in the case that the convoluted path is helical, but one structure utilizing an arrangement in which the loops or turns are not required to slide or be fully shifted will be described hereinafter.

In FIG. 2, in order to illustrate the structure required to move the loops 76 to the right while rotating the same, a block 87 is illustrated having arrows indicating the application of a force to the loops to drive the same to the right. Any suitable mechanism may be used, such mechanism according to the invention including a type of structure which may require modification of the drum to provide for the shifting of the loops as taught by several of the prior art patents referred to above.

The reference character 88 represents a target which may be cylindrical or segmented and surrounding the drum 58, as taught in said U.S. Pat. No. 3,829,373, spaced from said drum to establish a plasma vapor. According to the preferred structure, the target 88 is energized by a high voltage electrical energy source 90 by way of suitable connections indicated generally at 92 that pass through the wall of the vessel 52 by way of another pressure-tight passageway 94. The tuning components for target 88 and drum 88 and drum 58 are not shown. If the drum 58 is connected to ground or above ground, and the target 88 is at a very high potential which is effectively negative insofar as particle movement and collision is concerned, it will serve as the virtual cathode for an electrical field that is established between the drum 58 and the target 88. In some instances, the drum 58 may be biased at several hundred volts negative below ground which slightly decreases the total field but provides advantages offsetting the dark space above the substrate surface. This gives a harder deposit with lower resistivity.

According to a phenomenon which is well known, ionization of an inert nobel gas such as argon introduced from a source 96 through a pressure-tight passageway 98 into the interior of the vessel 52 provides ions that will strike the target 88 and knock off atoms driven thereafter to the surface of the substrate loops 76 coating the same. There may be dopant gas and/or gas replenishment of oxygen, for example, also introduced by way of the pressure-tight passageway 98. Certain oxide targets may lose oxygen at a faster rate than the metal of the oxide. None of the electrical cooling or measuring connections to the interior of the vessel 52 is shown in FIG. 2, nor is the means for driving secondary electrons from the space 100 illustrated in order to keep the view as simple as possible.

Before proceeding with additional descriptive materials in connection with the remaining figures of the drawings, comment should be made concerning the advantages of the structure as thus far described. The plasma which has been referred to comprises a cloud of particles comprising atoms of some substance to be deposited on the base or substrate, the cloud being achieved by electric or heat means. The difficulties of achieving a uniform plasma vapor along the length of movement of the substrate as experienced in the prior art is of no importance in the structure utilizing the invention since the substrate surface is repeatedly passed through the vapor plasma existing along the length of the target, that is from left to right in FIG. 2, for example. This tends to apply a uniform coating of the thin film on the exposed surfaces of the substrate member 70.

Additionally, the thickness of the coating is easily controlled and a substantial degree thereof readily achieved in a short space. In FIG. 2 for example, if the substrate 70 passed out directly as the coated substrate 78, the vessel would have to be many times longer in order to achieve a coating time which is achieved by means of the convoluted arrangement. Furthermore, the target would be required to be longer, more connections would be required and apparatus would be further complicated by reason of the additional length. Such additional length would not give the assurance of uniform coating and the throughput rate would be much less than a construction with the structure FIG. 2 or the other forms of the invention.

It is to be understood that the member 70 may have previously been coated with one or more thin films in other apparatus or in passes previously made in apparatus 110.

Figure 3:
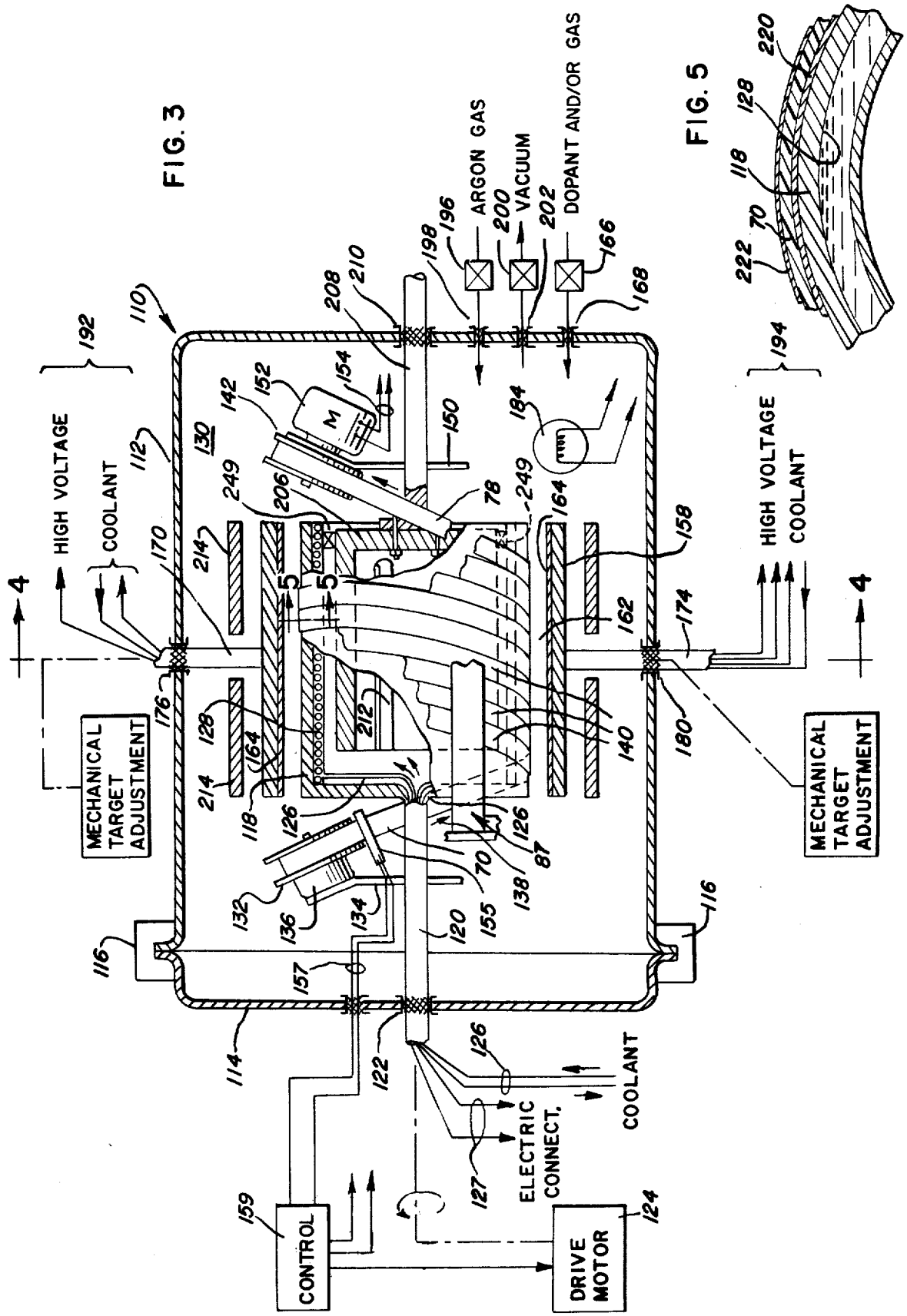
FIG. 3 is a diagrammatic sectional view taken generally through apparatus constructed in accordance with the invention for batch coating of substrate.
Figure 4:
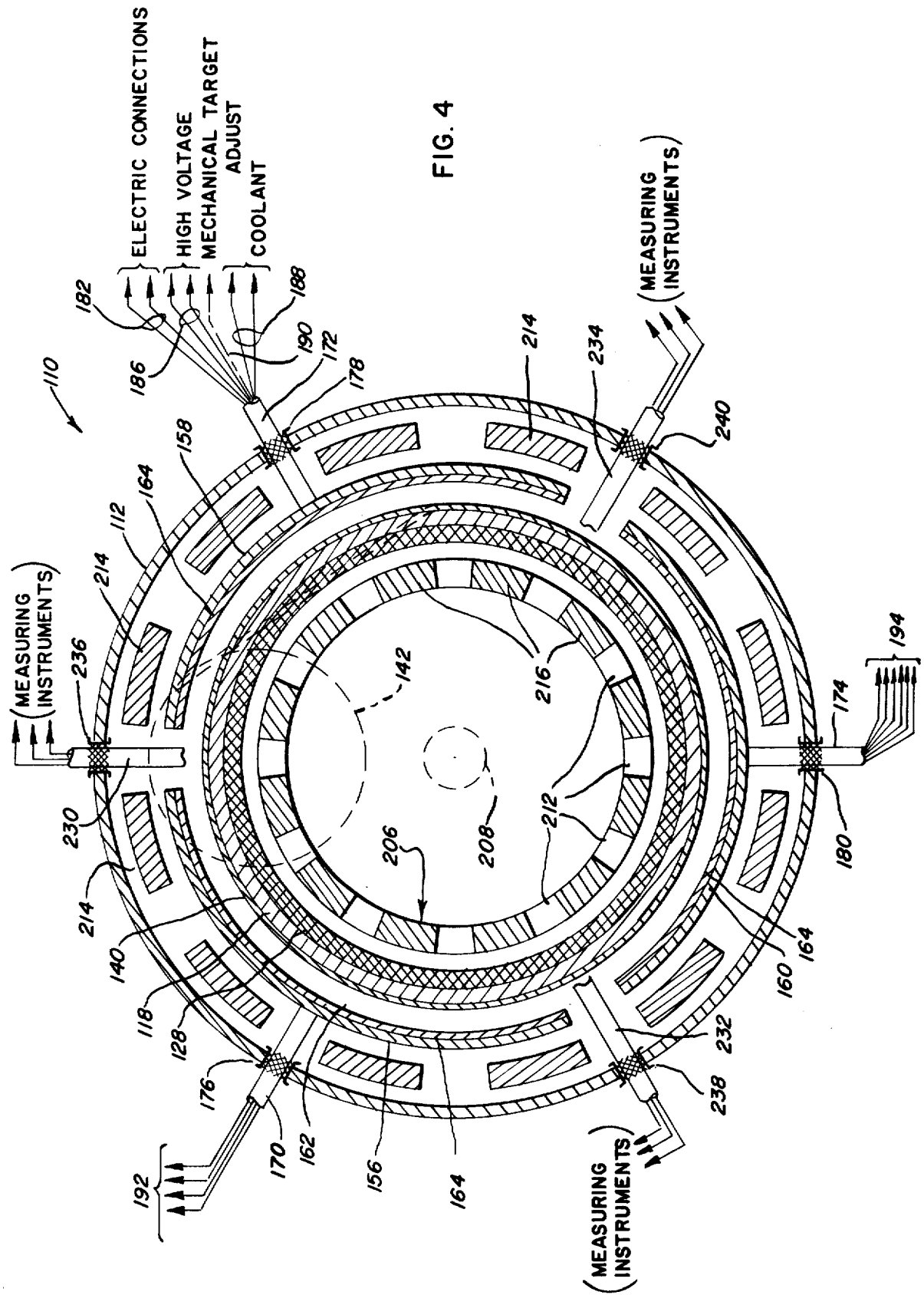
FIG. 4 is a transverse diagrammatic sectional view taken generally along the line 4—4 of FIG. 3 and in the indicated direction.

FIGS. 3 and 4 illustrate a form of apparatus of the batch type for use in coating a thin film on an elongate substrate member. The apparatus is designated generally by the reference character 110 and while still in diagrammatic form, nevertheless illustrates considerably more details than are illustrated in FIGS. 1 and 2. There is provided a pressure vessel 112 having an end closure 114 held in hermetic sealed engagement with the left open end of the vessel 112 by any suitable means shown in block form at 116. Each of the vessel 112 and closure 114 will have flange means cooperating in connection with the securing means 116 which should be of a quick disconnect variety.

On its interior, the vessel 112 is provided with a drum 118 of stainless steel or the like supported and rotated by a shaft 120 which passes through the closure 114 by way of a pressure-tight passageway 122. As previously mentioned, the symbol used to indicate the passageway 122 is not intended to be limiting and may encompass any of a wide variety of passageways capable of transmitting power, motion, electricity, signals, coolant, etc. without modifying the atmosphere on the interior of vessel 112. Also, it is preferred that most of the passageways be located and the power lines, etc. be withdrawn through the closure 114.

Figure 6:
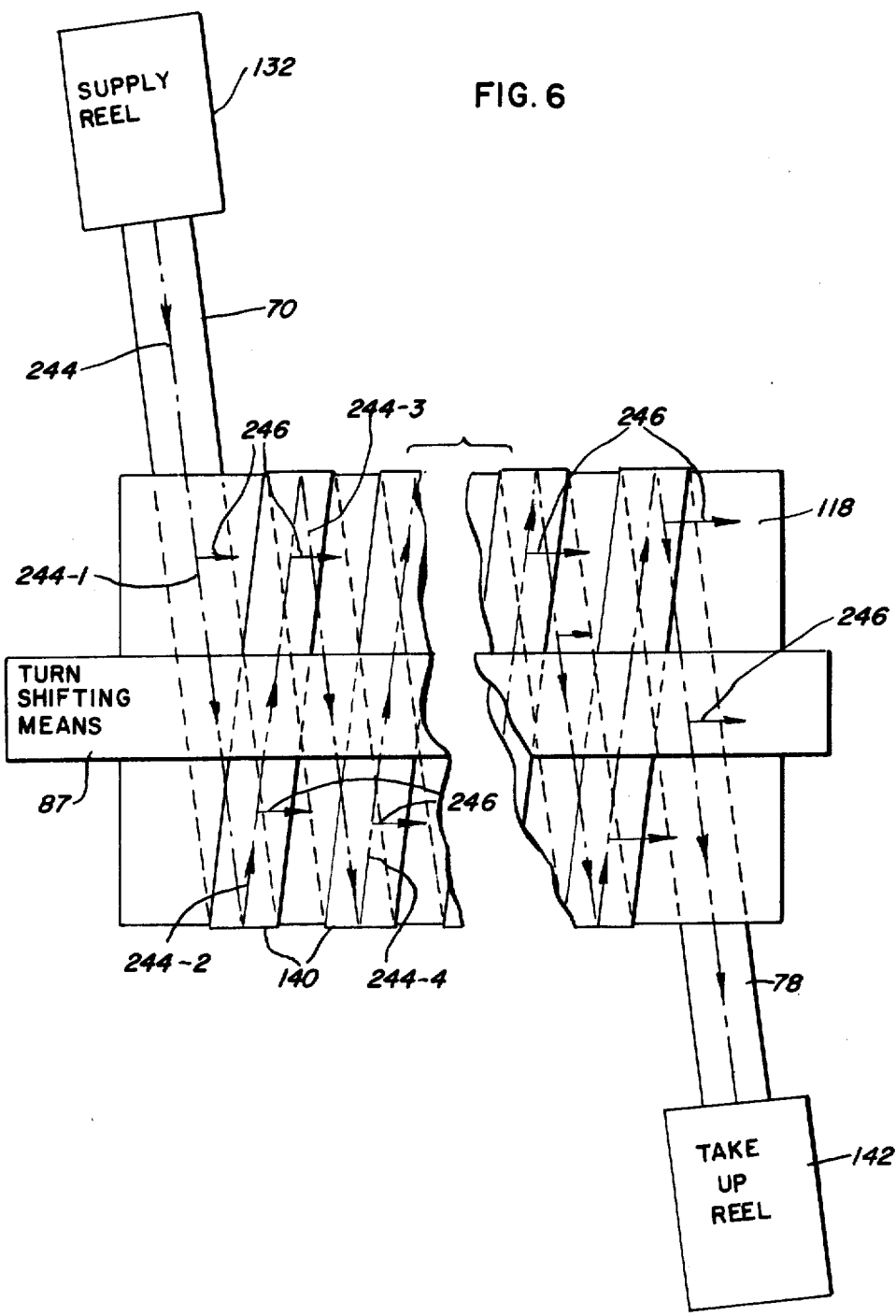
FIG. 6 is a highly diagrammatic view taken generally in plan used in explaining the operation of the apparatus of FIGS. 3 and 4.

The shaft 120 is rotated by a suitable drive motor 124. The speed of the motor is controlled as are other variables which determine operating characteristics of the apparatus 110. The shaft 120 will usually be hollow and will carry coolant conduits 126, electric cables and the like. Coolant conduits 126 are shown on the interior of the drum extending to cooling coils or manifolds provided radially interior of the drum surface as shown in 128. The cooling means 128 may take the form of coils or a chamber, such as shown in FIG. 6, such means being crosshatched in FIG. 4. Coolant is circulated in the form of water, liquid nitrogen, or the like, in order to keep the substrate member cool while the thin film is being deposited thereon. Actually, temperature, plasma pressure, electric field density and other information is continuously monitored and controlled for best results as mentioned below.

On the left side of the chamber 130 which is defined within the vessel 112, there is provided a source of substrate member comprising a reel 132 mounted on a bracket 134 suitably supported in some manner, with a friction clutch or the like 136 between the reel and the bracket to provide a drag on the substrate member 70 being pulled off the reel 132. As in the case of FIG. 2, the substrate member 70 is uncoated. Conveniently, it can be premasked to enable the thin film to be applied in the form of frames. An edge may also previously have been provided with a strip of some conductor such as aluminum for purposes mentioned above. It passes or is guided in the direction of the arrow 138 to wind around the exterior surface of the drum 118 in a plurality of tight turns arranged side by side along said surface. As shown in FIG. 3, the turns are contiguous, forming the loops 140 so that there is a relatively large number along the axial length of the drum 118. This would also be true in apparatus 50 as shown in FIG. 2, this latter being shown with open loops for explanatory purposes.

As the drum 118 rotates, the loops 140 rotate in helical paths and are pushed or shifted axially by the loop or turn shifting mechanism 87 which, in this case, is the equivalent of the structure 87 of FIG. 2. As this occurs, the substrate member is coated with a thin film and is led or guided off the righthand end as a coated substrate member 78, there being wound onto takeoff means such as a reel 142 mounted on a suitable bracket 150 and driven by a motor 152 controlled from externally of the vessel 112 by suitable power leads indicated at 154. Connection to the exterior of the vessel 112 is not shown but is readily understood as passing through a suitable pressure-tight passageway.

As indicated in FIG. 1, when a length of substrate 70 has been fully coated, becoming the coated substrate 78, and substantially all of the length of substrate has been transferred from the reel 132 to the reel 142, the operation of the apparatus 110 is stopped. Preferably a detector indicated symbolically at 155 senses when the end of the substrate member 70 has been reached and through the transmission line 157 passing through the closure 114, operates control 159 that stops the motor 124, shuts off the apparatus 110, etc. Then a new reel can be mounted and spliced to the old end of substrate member 70 without the need for rethreading the same. The closure 114 is then opened through the use of the means 116 and the entire drum 118 with the reels 132 and 142 and associated apparatus removed, being supported on a carriage such as 34 The full reel 142 is replaced with an empty reel, and a full reel 132 of substrate 70 to be coated replaced on the bracket 134 in substitution for the now empty reel and spliced to an end left threaded around the drum 118 and onto the reel 142 and the entire carriage 34 is moved forward after which the closure 114 is sealed.

The difficulty with this arrangement is that the plasma vapor condition within the chamber 130 must be dissipated and thereafter started up again. A better method would be to have the substrate member pass through the chamber 130 continuously or to have a pressure lock enabling the reel 132 and its supporting apparatus to be available for splicing additional lengths onto the expiring length without disturbing the plasma vapor condition. In such case, the reel 142 would be constructed to accommodate the very long length of coated substrate member 78. The detector 155 would in such case be practically essential.

On the interior of the vessel 112, there is provided a target or as probably more convenient, a series of targets such as shown at 156, 158, and 160. Such targets preferably are in the form of sections of a cylinder, all being aligned and equally spaced from the drum 118 thereby providing a cylindrical gap 162 between the targets 156, 158, and 160 and the drum 118. Such structure is described in said U.S. Pat. No. 3,829,373. Since, in effect, all three target sections are a single target or cathode, they will be referred to collectively as target means 156 - 158.

The target means are usually formed of a metal backing having a surface layer or laminate 164 that is composed of the material which is to be sputtered onto the exposed surface of the substrate wrapped around the drum 118. In the first-mentioned copending application, the electrophotographic film has a thin film which is formed of n-type cadmium sulphide, zinc indium sulphide or the like. The resulting thin film is flexible, transparent, inorganic, photoconductive, and electronically anisotropic. In the case of cadmium sulphide, the target surface 164 would comprise cadmium and the sulfur could be introduced into the chamber 130 as a dopant from a suitable source (not shown) through a valve apparatus 166 by the way of a pressure-tight passageway 168 in suitable proportions so that the deposit is stoichiometrically correct. In the case of zinc indium sulphide, the zinc and indium in an alloy form would comprise the layer 164 and the sulfur admitted in gaseous form.

Each target section is supported by suitable means such as, for example, the hollow rod or bar support means 170, 172 and 174 respectively. Each of the support means is engaged to the respective target section, shown for convenience in illustration as passing through the wall of the vessel 112 by way of pressure-tight passageways 176, 178, and 180 respectively. Preferably the support means passes through the closure 114. The support means in each case would normally be hollow and would carry electricity, coolant and the like, for the operation of the apparatus. For example, as shown in connection with the support member 172, there are electrical connections 182 for various electrical apparatus on the interior of the chamber 130 such as the operation of the motor 152 or the tungsten lamp 184 (to be described). In the same support member 172, there may be high voltage leads 186. It is understood that the preferred version of the apparatus of the invention establishes a radio frequency field in the gap 162 of the order of kilovolts and hence the target means are required to be at a high negative voltage with respect to the drum 118. The support member 172 may carry coolant conduits 188 which will be required to keep the target means cool. The coolant may be liquid nitrogen or other suitable materials. Manifolds, tubes, chambers or the like may be built into or closely connected with the target means 156 – 160 to carry the coolant, none of these being shown.

As the target section 156, 158, and 160 become consumed, they are required to be mechanically adjusted and such means must also be provided in connection with the support members 170, 172, and 174. The adjustment is achieved by any suitable structure and is symbolically indicated by the broken line 190. Similar connections, conduits, mechanical adjustments, etc. are used in association with the other support members, this being indicated at 192 and 194.

In operation of the apparatus 110, argon gas or other inert gas is introduced by way of some apparatus (not shown) through the valve 196 operating in connection with a pressure-tight passageway 198. The argon gas is introduced after a vacuum of substantial nature has been drawn. A vacuum pump (not shown) is used, connected through a valve 200 and the pressure-tight passageway 202. Typically, the chamber 130 is pumped down to a pressure of the order of $10^{-7}$ torr, and the argon that is admitted will bring the pressure in the chamber up to about 60 millitorr.

The action within the chamber 130 is primarily produced in the gap 162. The radio frequency field ionizes the argon atoms causing a bombardment of the layer 164. The atoms of the material from the layer 164 are knocked out and form a cloud which is driven by the negative potential toward the drum 118. These atoms settle upon the surface of the drum which, of course, is covered by the substrate member 70 so that a coating builds up on the surface of the substrate. The rear surface of the substrate is protected since it lies directly against the surface of the drum.

In addition to the cooling means 128 of the drum and similar cooling means for the target means 158 – 160, another form of cooling is used in the apparatus 110. Secondary electrons are produced during the existence of plasma vapor. These secondary electrons impinge against the substrate and will heat it with no useful function. In order to drive the secondary electrons out of the gap 162 a high density magnetic field is established across the gap, polarized in such a way that the secondary electrons are driven out of the gap in a direction axially of the drum 118. In order to establish such magnetic field permanent magnet structures are used. In FIG. 3, a drumlike cylindrical, permanent magnet 206 is supported on a shaft 208 that passes through the end wall of the vessel 112 at the pressure-tight passageway 210. The cylindrical magnet 206 is preferably slotted as shown at 212 along its length to shape the field and concentrate the same in juxtaposition to a plurality of magnet members 214 disposed coaxially and radially outward of the target sections 156, 158, and 160. The magnet sections 214 are permanently magnetized and cooperate with the solid axially extending portions 216 formed in the cylindrical magnet 206 along the length thereof. The field produced is radial with respect to the gap 162.

As an example of the temperatures which are involved, a typical apparatus would have the target means 156–158 at a temperature of 1200° C plus or minus a few hundred degrees. This presumes cooling, as for example, by water or other coolant. The drum 118 would rise to 800° C or more, thereby destroying a substrate member made of polyester, for example, unless it were cooled to considerably less than that. The substrate surface should be of the order of 80° C for efficient deposit and for maintaining the integrity of the substrate member 70 throughout the coating process.

There will normally be some shrinking of the substrate member during the process of applying the thin film thereon notwithstanding efforts made to precondition the same beforehand as disclosed in said copending application. In the case of prior structures, such shrinking poses problems which are difficult of solution. In the case of the invention, the shrinking causes the substrate member 70 to engage more tightly upon the surface of the drum 118 or the drum 58 illustrated in FIG. 2. As mentioned, when the convoluted movement is helical there must be a shifting or sliding of the turns axially along the surface of the drum. Substantial shrinking may make such action difficult to accomplish, but if capable of being achieved the shrinking will aid in applying a uniform coating because it will prevent buckling and bulging of the substrate member during the coating process.

A structure which obviates the difficulties caused by shrinking and in which only the simplest of turn shifting means is required is described hereinafter in connection with FIGS. 7, 8, and 9.

In the course of operation of the apparatus of the invention, since the substrate member 70 and even the thin film deposited thereon are transparent or at least translucent to a very high degree, thermal radiation from the target means 156 – 160 will pass through both the thin film and the substrate member 70 and will tend to be reflected from the surface of the drum 118 back through the substrate member 70. The heating of the substrate member will therefore be increased.

According to the invention, it is preferred to apply a thin surface to the drum 118 which is heat absorbent. In the case of a drum made of aluminum, for example, such surface could be black anodized as indicated at 220 in FIG. 5. In the case of a stainless steel drum, any suitable black coating may be applied which will absorb the infra red rays passing through the substrate member and transmit the heat to the cooling means 128. In FIG. 5 the cooling means is shown as a chamber formed in the drum 118. In said FIG. 5, the substrate member 70 is shown with exaggerated thickness and a thin film deposit 222 is shown formed on the surface thereof. It should be understood there may be more than two thin films. This is explained in the said first-mentioned copending application. The black coating 220 should be stable under all conditions met within the chamber 130. Black nickel or other metal deposit plated on the drum 118 would be satisfactory for a stainless steel drum.

In the said first-mentioned copending application, the electrophotographic film disclosed has a substrate which is formed of sheet plastic and two thin film layers are deposited on the surface of the substrate member. The substrate member is required to be electrically insulating in character. The next layer is an ohmic thin film layer that is conductive in nature for the purpose of removing electrons from the outer thin film layer. It is formed, in one case, of indium oxide about 500 Angstroms thick. Thereafter, the photoconductive layer which is about 4,000 Angstroms thick is deposited. It will be necessary to pass the substrate member through two processes for applying the two layers. Thus, it should be understood that the substrate member 70 in FIG. 3, while it may be considered uncoated insofar as the apparatus 110 is concerned, may previously have been coated with one thin film layer or more in another plasma vapor apparatus as previously mentioned.

To indicate some practical aspects of the apparatus, a typical apparatus 110 will have power consumption of the order of 100 kilowatts. The drum 118 will have a diameter of approximately 40 inches and the gap 162 would be approximately two inches.

Control of the operation is achieved by various sensors located at different places within the chamber 130. Conduits for the electrical leads or cables to provide signals are shown in FIG. 4 at 230, 232 and 234, each conduit being shown passing through the wall of the vessel 112 by way of suitable pressure-tight passageways indicated at 236, 238, and 240. Preferably, all such passageways are in closure 114. Some of the measurements to be made are thin film thickness, pressure differentials, temperatures of various parts, surfaces and components. Sensor conductors may be carried in any of the support members 170, 172, or 174, through the shaft 120, the shaft 208, or even through separate conduits or cables passing through the wall of the vessel 112 or closure 114.

During the sputtering process, there is an electron charge build-up which occurs on the surface of the thin film coatings. This electron build-up may comprise metastable neutral particles, slow electrons, argon atoms, etc. Presence of such charge can adversely effect the rate of deposition and the uniformity, especially if the charge build-up is localized. The charge is readily leaked off by neutralizing the same with photons produced within the chamber 130. The tungsten lamp 184 in an explosionproof envelope may be provided and the lamp is kept lit through the process. The leakage occurs continuously so that there is no charge build-up.

Some mention should be made at this point concerning the control of the process described, some of the technique being known and other aspects being peculiar to the type of coatings applied for the construction of the electrophotographic film of the first-mentioned copending patent application.

Temperatures must be controlled within the vessels 12, 52 and 112 within narrow ranges for best results. This is achieved by monitoring the temperatures through the use of gauges and instruments and feeding back information to automatically maintain temperatures. For example, the crystalline structure will in certain materials deposit most uniformly at 80° C with the crystals typically having a diameter of .1 micron. This type of thin film deposit in the case of the electrophotographic film of the second copending application will respond to very short wave lengths such as X-rays.

The plasma vapor pressure and electrical field density determined the rate of deposition. These are monitored continuously by suitable gauges and the information used to control the admission of the noble gas and the vacuum pumping. Other quantities are measured and used for controls.

It is pointed out that a considerable portion of the hardware used in connection with apparatus of this type has not been shown since the same is conventional and can be supplied by those skilled in the art. Many refinements can be made. For example, mechanical support for the drum and the cylindrical magnet 206 can be furnished although the same are shown cantilevered in their mountings in FIG. 3. Bearing means, cooperatively engaged between the interior of the drum 118 and the exterior of the cylindrical magnet 206, are shown at 249. Such bearing means will be supported on one or the other of the juxtaposed components that come into engagement when the two are telescopically associated.

In FIG. 6 there is illustrated a diagrammatic representation of the drum 118 with the supply reel 132 and the take-up reel 142 of FIG. 3, the view being generally from above. The block 87 extends the entire length of the drum 118 in order to indicate that in the case the convoluted path of the substrate member is helical there is need for shifting of the loops 140 axially in the same direction that the rotation of the drum would normally carry the loops or turns along the entire length of the drum. If a tumbler or other periodic pushing device is located at the left-hand end of the drum as the turn-shifting means 87, its force is required to be transmitted to all turns on the drum 118 to shift them all simultaneously while the substrate member is being applied to the drum.

The path of the substrate member 70 is indicated by a broken line 244 and may be followed around the drum 118 by means of the arrows along that line. For example, at 244-1 the first turn goes under the drum and comes up on the top side at 244-2, goes around and down to start the second turn at 244-3, comes up as 244-4, etc. The short arrows at 246 indicate the application of a force axially to the right to the loops or turns 140 by the turn-shifting or convolution-shifting means 87.

The invention as thus far described discloses all of the features thereof in a manner which is easily understood. The movement of the substrate member in a convoluted path along the drum from one end to the other is believed clearly set forth in connection with the cases that such path is helical. It should be pointed out, however, that the practical construction of the apparatus which has thus far been described will be to some extent more complicated than would seem to be indicated by the illustrations and explanation. The principal component that is involved in such complication in the turn-shifting means have been indicated at 87. As will be seen from a study of the patient references mentioned above, these mechanisms become involved since it is preferred that the drum surface be imperforate to enable easy cooling and since pushing the substrate axially is not always practical. This is especially true where the substrate member is quite thin and delicate. A more practical and simple structure is described in connection with FIGS. 7, 8, and 9 below.

Figure 7:
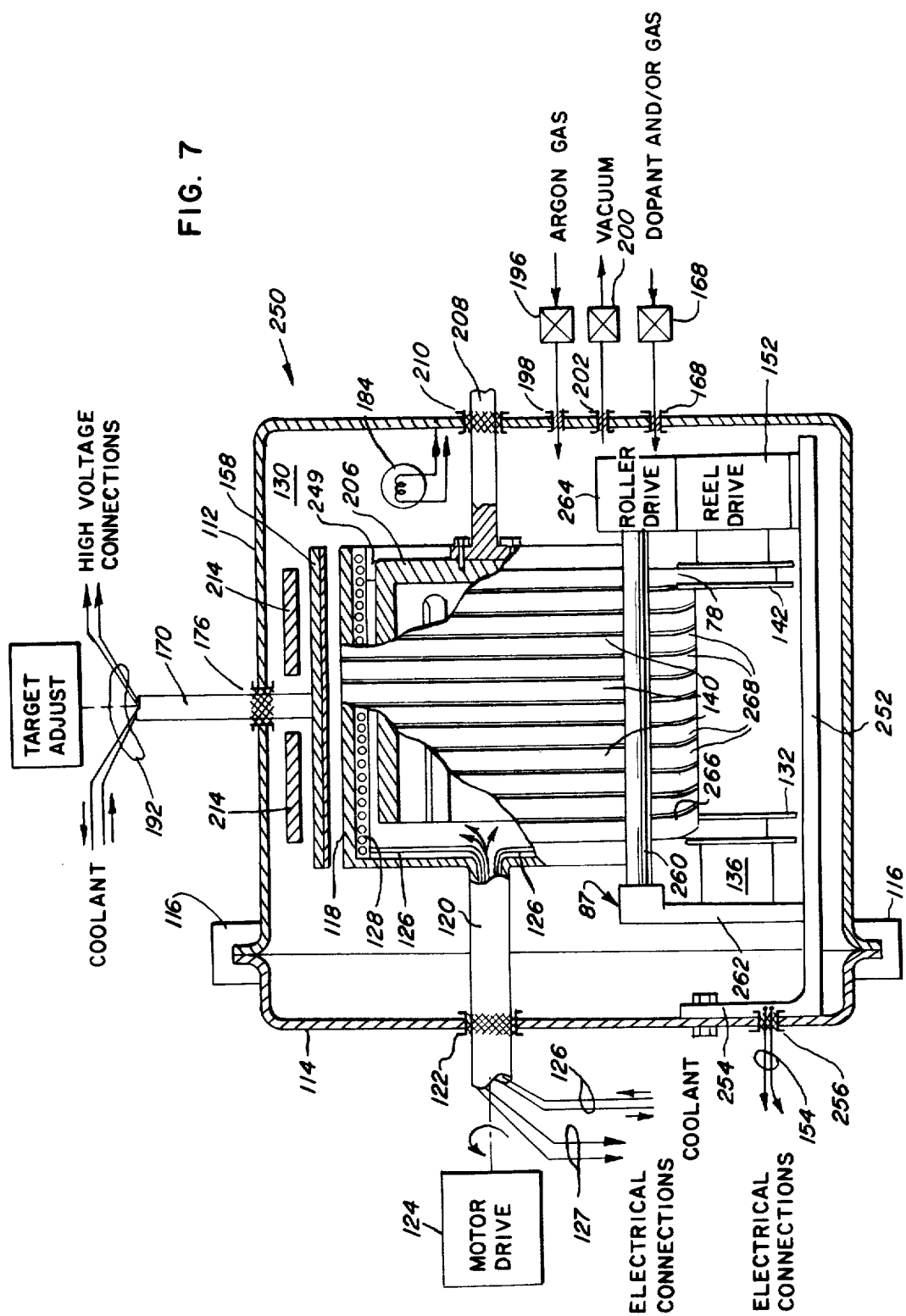
FIG. 7 is a view similar to that of FIG. 3 but showing a modified form of the invention which avoids the necessity for sliding the turns axially of the drum.
Figure 8:
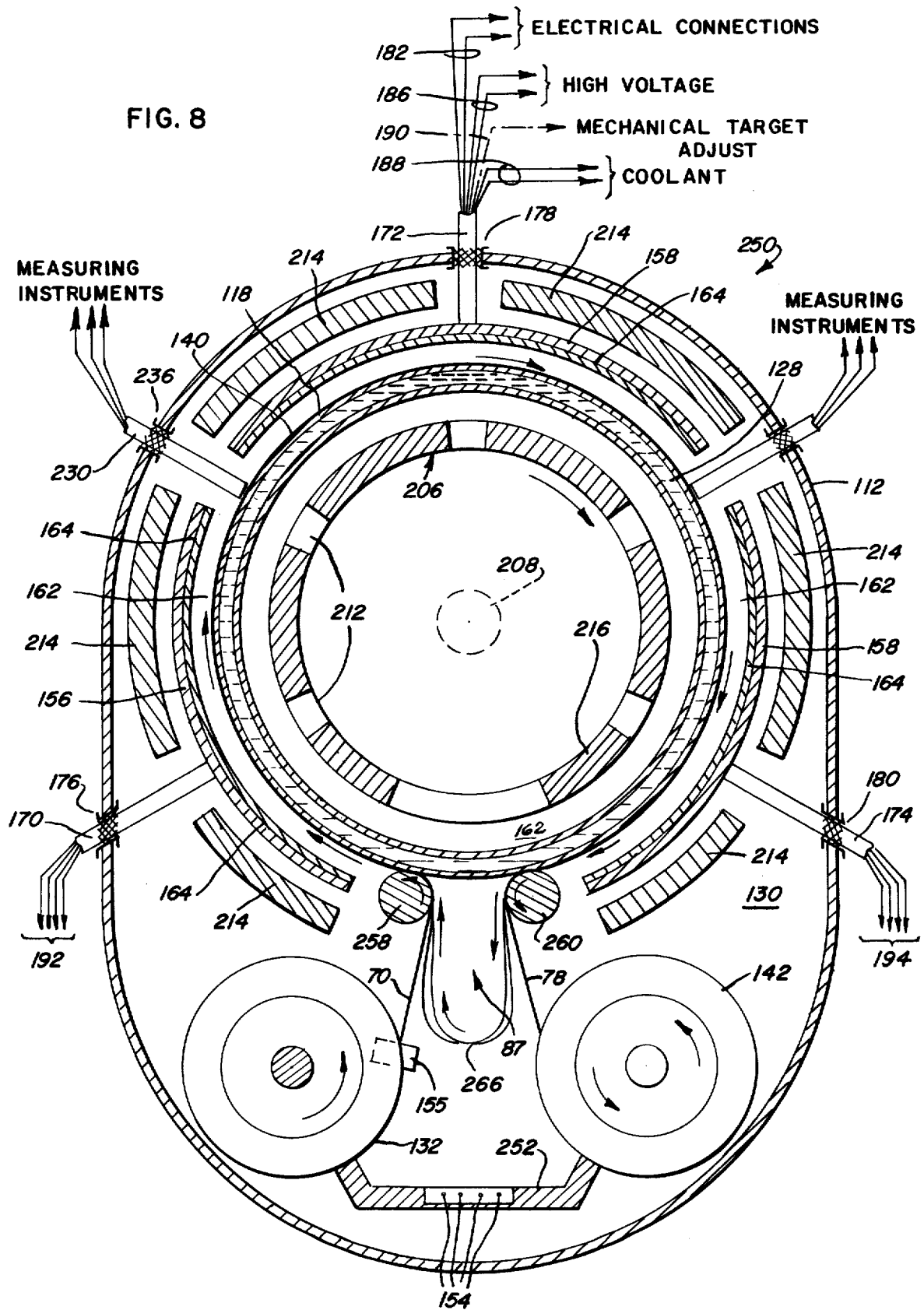
FIG. 8 is a sectional view taken through the apparatus of FIG. 7 generally transversely of the axis of the drum.
Figure 9:
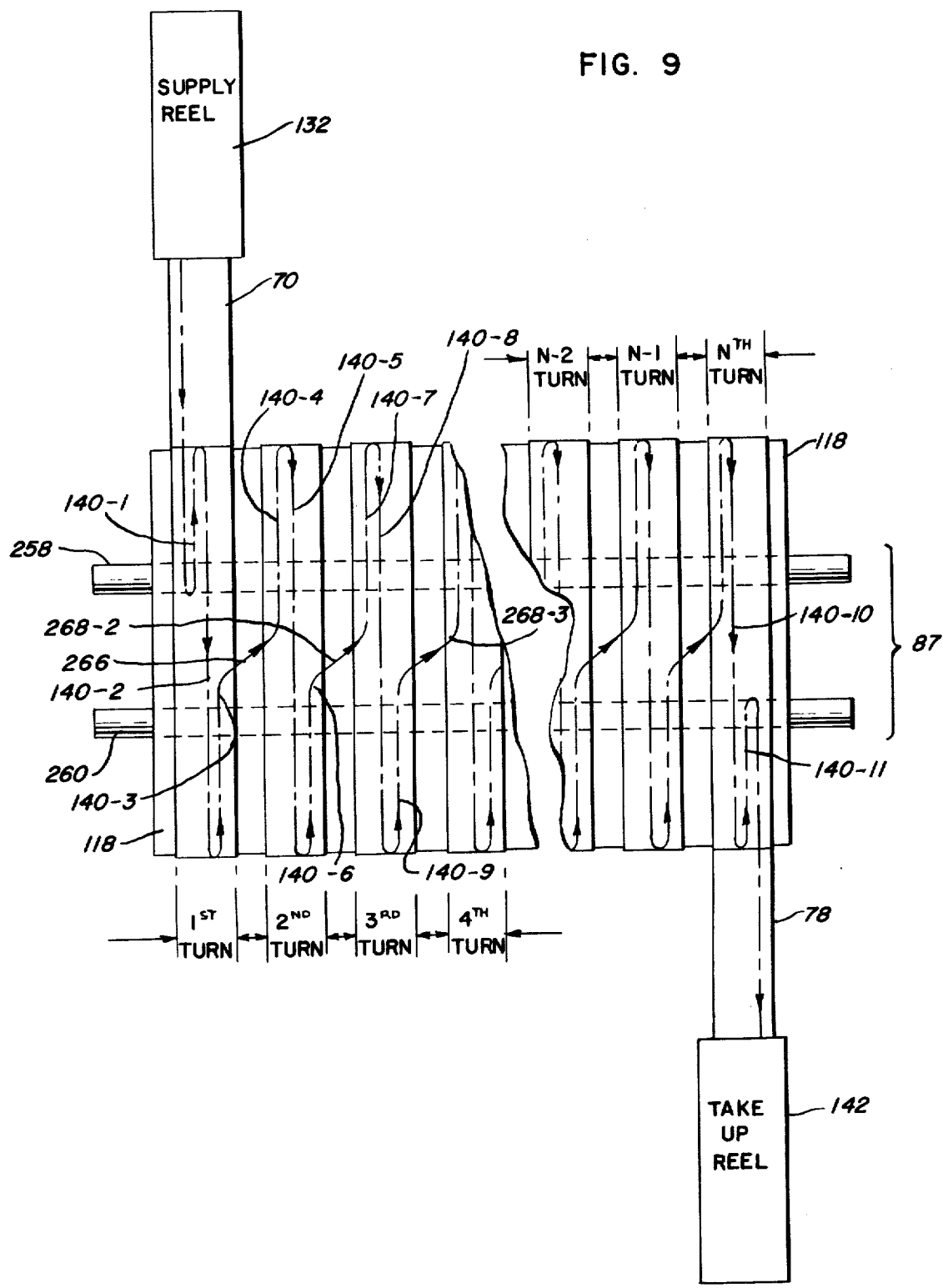
FIG. 9 is a view similar to that of FIG. 6 but used in explaining the operation of the apparatus of FIGS. 7 and 8.

The same reference characters used in connection with the apparatus 110 will be applied to the same or equivalent structures in FIGS. 7, 8, and 9 where feasible.

The apparatus of FIGS. 7 and 8 is designated generally as 250 and as in the case of FIGS. 3 and 4 is illustrated as being used in a batch process. Obviously, the storage and take-up reels could be on the exterior of the apparatus for a continuous type of processing.

The apparatus 250 differs from the apparatus 110 primarily in the construction of the turn-shifting means 87. In practically all other respects it is substantially the same. Accordingly, the construction and operation of the overall system may be taken to have been described in connection with FIGS. 3, 4, 5 and 6.

The supply and take-up reels 132 and 142, respectively, are conveniently mounted closer to the bottom of the chamber 130 than in the case of the apparatus 110. Additionally, the axes of these reels are both substantially parallel with the axis of drum 118 so that the uncoated end 70 of the substrate member and the coated end 78 both have in paths which describe planes normal to the axis of the drum 118. These reels are shown mounted on a base 252 which can be hollow and carry electrical conductors for the energizing of various motors and other components. For example, a bracket 254 secured to the closure 114 receives the ends of the electrical leads 154 through a pressure lock 156. The reel 132 will have the drag device 136 and the reel 142 will have a drive motor 152 for take-up purposes, the motor being energized by the connections 154 passing through the hollow base 252.

The loops or turns 140 of the structure 250 are again tightly wound around the drum, but although the overall path of movement of the substrate member is convoluted, on the drum the respective turns are all parallel and normal to the axis of the drum 118. The turn-shifting means 87 comprise a structure which passes a short section of each turn from one position to the next at the bottom of the drum 118.

A pair of stainless steel rollers 258 and 260 is firmly mounted for rotation in engagement with the bottom of the drum 118. The pressure roller 258, not visible in FIG. 7 but shown in section at the left in FIG. 8, is an idler but is pressed tightly against the drum 118. It is conveniently mounted on a bracket or standard which is not seen in the views but is substantially the same as the standard 262 that mounts the left-hand end of the roller 260. This standard 262 and those mounting the pressure roller 258 conveniently are secured to the base 252.

The overdrive roller 260 extends between the standard 262 and the roller drive 264 and is tightly engaged against the bottom of the drum 118. It is referred to as an overdrive roller because it is driven by the drive 264 at such a speed that it tends to rotate faster than the rate at which it would go if directly driven by the drum 118.

The uncoated substrate member 70 is led off the reel 132 against the drag of the mechanism 136 and engaged in the converging nip between the roller 258 and the drum 118. It passes completely around the drum in a right cylindrical configuration defining a straight path coaxial of the drum and its opposite edges lying in planes normal to the axis of the drum. At the roller 260, this first turn of the substrate member 70 passes into the converging nip between the roller 260 and the surface of the drum 118 and emerges from the diverging nip.

At this point, a hanging fold or bight is arranged as shown at 266 loosely hanging down between the rollers 258 and 260. It commences at the diverging nip between the roller 260 and the drum 118, forms the bight and then enters the converging nip between the roller 258 and the drum 118, but it is shifted axially by at least the width of the substrate member 70 so that it starts a second turn around the drum. Thus, the bight is slightly twisted, but since it is hanging loosely and the substrate member is quite flexible, it readily follows the shifted position without difficulty. Repeating, the first turn starts at the roller 258, passes around the drum 118, passes under the roller 260, forms the first hanging bight 266 which begins at the end of the first turn and ends at the start of the second turn.

Only the first bight turn is designated 266, the remaining bights being designated generally 268.

There are as many bights as there are turns or loops 140, each bight hanging loosely and being long enough to permit the substrate member to turn slightly and follow the contours of the bight in passing to the beginning of the following turn under the pressure roller 258.

The pressure roller 258 being pressed tightly against the drum 118 provides a drag on the substrate member 70 tending to pull it tightly against the surface of the drum 118. The overdrive roller 260 being driven at a speed slightly more than needed to provide direct transfer of rotation from the drum 118 tends to pull the substrate member even tighter against the surface of the drum 118. Thus, each turn of the substrate member is tightly held against the drum, with the hanging bights falling loosely beneath the drum 118. The shift from turn to turn, instead of being required around the entire drum and along the length of the drum, is required only to be accomplished in the hanging bights 268, where the looseness and flexibility of the substrate member makes it a simple matter.

The last or nth turn on the drum of the now coated substrate member 78 passes out of the diverging nip between the roller 260 and the drum 118 and is wound directly onto the take-up reel 142. The drive motor 152 for the take-up reel 142 is arranged with suitable mechanisms to keep this length of the substrate member taut.

The rollers 258 and 260 may be slightly bulging in their centers to compensate for flexing along the lengths thereof in order to maintain the pressure against the drum to keep the turns tightly pressed to the drum. This will be aided by the slight shrinking of the substrate member. The bights 266 and 268 are chosen to depend for a substantial length - say six inches for a drum 118 which is about 40 inches in diameter so that slight variations do not take up so much of any bight to bring it too close to the drum to enable the twist and shift to be effected. Slippage on the drum is almost impossible and the thin film deposited, especially where of the nature described in said first copending application, is so hard that the rollers 258 and 268 are not likely to scratch the coating. Simple detecting means to sense the unusual shortening of any bight can be provided to stop the apparatus.

Attention is invited to FIG. 9 which is a simplified diagram to aid in an explanation of the manner in which the rollers 158 and the hanging bights act as turn-shifting means.

The substrate member 70 is paid off the supply reel 132 and passes partially around the roller 258 at 140-1 to start the first turn. It comes around the side of the drum and over the top from the upper portion of the first turn at 140-2 and then down and partially around the overdrive roller 260 at 140-3. It then forms the first hanging bight 266 which as will be seen, shifts to the right and comes once more partially around the pressure roller 258 at 140-4. It now forms the second turn, moving on the path 140-5, down under the drum 118 and partially around the overdrive roller 260 at 140-6. This is the completion of the second turn, the second bight 268-2 now being formed which moves to carry the substrate member partially around the roller 258 in the space occupied by the third turn. The third turn commences at 140-7 right after the pressure roller 258 has been passed and is formed at 140-8 over the top of the drum 118. Again the substrate member passes around the bottom at 140-9 partially around the roller 260 and forms the third bight 268-3. This procedure continues until the last turn 140-10 has been formed and the now coated substrate member 78 passes partially around the roller 260 at 140-11 and directly to the take-up reel 142.

Mention should be made concerning the construction of the target means 88, 158, etc. The actual members can be plates, strips, or even rods arranged arcuately to form what is in effect a surface. Where made of a plurality of rods, the replacement is easy and economical and in addition rods of different materials may be arranged side by side in any desired quantitative proportion to meet requirements of depositing alloys, compounds and the like. Accordingly, reference to "arcuate members" will include arrays of rods, strips or plates occupying arcuate configuration. In the case of rods, these may be hollow and carry coolant in their interiors.

Many details have not been described in the above specification because the same are known in the prior art. The exact mechanical and electrical components and the construction thereof need not be explained to those skilled in this field. The number of turns of the substrate member can be varied in accordance with the requirements of the apparatus, but typically could be ten turns of 40 inches in diameter. Motors and driving mechanisms must meet the demands of the apparatus with respect to power, heat dissipation, corrosion, lubrication, etc. The electrical specifications must consider the frequencies and voltages to be met and the current densities being handled. For example, at least in the United States and many other places it is required that the radio frequency used to energize the target be 13.56 megahertz. This type of electrical energy must be handled with special conduits and connectors. Shielding problems arise to be taken care of as well. Tuning condensers for timing targets and drums to this frequency must be provided.

It follows from the above that the invention may take many forms of varied nature. Such variations are intended to be included within the purview of the coverage granted under the Patent Laws as enunciated in the claims appended hereto.

What is desired to secure by Letters Patent of the United States is:

1. Apparatus for depositing a thin film on a length of substrate which comprises:
   supply means carrying a supply of substrate to be coated,
   take-up means for accumulating coated substrate length,
   a pressure vessel having means therein for establishing a sputtering plasma condition within the vessel,
   anode means mounted in the vessel,
   cathode means comprising a plurality of targets secured on the interior of the vessel, each target having a surface formed of the material to be sputtered, the surface facing the exterior surface of the anode means but spaced therefrom, the said targets being circumferentially spaced with the said planar surfaces thereof defining at least part of a cylindrical surface that is coaxial with but larger in diameter than the anode means whereby to form a plurality of consecutive arcuate gaps within which the sputtering plasma is adapted to be established,
   a high voltage source connected in a circuit which includes the anode means and the cathode means,
   structure disposed within the vessel and arranged to guide the substrate length from the supply to the take-up means in a configuration establishing a tortuous path including at least a portion of a circular turn around the anode means, for substantially lengthwise movement of said substrate length and
   the said path being such as to expose only one surface of said substrate to the sputtering plasma condition while said substrate is in said tortuous path.

2. The apparatus as claimed in claim 1 in which structure is provided for controlling at least the surface temperature of the substrate length while it is moving along the path.

3. The apparatus as claimed in claim 2 in which means are provided to cover the second surface of said substrate length while it is moving along said path.

4. The apparatus as claimed in claim 1 in which the tortuous path comprises a series of convolutions and said anode means comprises a drum having at least a substantial portion of each convolution engaging the exterior surface of said drum.

5. The apparatus as claimed in claim 4 in which means are provided to rotate the drum and carry the convolutions circumferentially of the drum and to move the same axially along the length of the drum.

6. The apparatus as claimed in claim 5 in which said means for moving the convolutions axially along the length of the drum comprise convolution shifting means.

7. The apparatus as claimed in claim 6 in which said convolutions form a helix along the length of said drum.

8. The apparatus as claimed in claim 4 in which said targets are of arcuate configuration arranged generally coaxial and telescopically of said drum and spaced outwardly thereof to form an annular plasma vapor gap between each of the said targets and the outer surface of said convolution.

9. The apparatus as claimed in claim 8 in which said targets comprise a plurality of arcuate members at least some of which are circumferentially spaced apart having means for individually adjusting the respective members.

10. The apparatus as claimed in claim 8 in which means are provided for establishing a magnetic field across said gap to sweep secondary electrons out of said path.

11. The apparatus as claimed in claim 10 in which said last means comprise coaxial cooperating magnetic members on the inside of said drum and outside of said targets and the field is radial.

12. The apparatus as claimed in claim 1 in which means are provided in said vessel to decrease surface charge on said substrate comprising a source of photons in said vessel.

13. The apparatus as claimed in claim 5 in which said drum surface is provided with heat absorbing means.

14. The apparatus as claimed in claim 13 in which said last means is a black coating.

15. The apparatus as claimed in claim 1 in which the tortuous path comprises at least one convolution and said structure comprises a drum having at least a substantial portion of the convolution engaging the exterior surface of the drum.

16. Apparatus for depositing a thin film on a length of substrate which comprises: a supply of substrate to be coated, means for accumulating coated substrate length, a pressure vessel having means therein for establishing a plasma vapor deposition condition within the vessel, structure disposed within the vessel and arranged to guide the substrate length from the supply to the accumulating means in a configuration establishing a tortuous path for substantially lengthwise movement of said substrate length and the said path being such as repeatedly to expose one surface of said substrate length to the depositing condition while said substrate is in said tortuous path, said tortuous path comprising a series of convolutions and said structure comprising a drum having at least a substantial portion of each convolution engaging the exterior surface of said drum, means for rotating said drum and carrying the convolutions circumferentially of said drum to move same axially along the length of said drum, said means for moving said convolutions axially comprising convolution shifting means, said convolutions forming a helix along the length of said drum, said convolutions comprising a series of parallel turns arranged along the length of the drum and the convolution shifting means comprising structure for forming a cross-connecting bight between successive turns at the bottom ends thereof.

17. The apparatus as claimed in claim 16 in which the bights hang loosely to enable the flexing thereof.

18. The apparatus as claimed in claim 16 in which said shifting means include a pair of rollers engaging the surface of said drum and having the substrate engaging said exterior surface of the drum tightly pressed against said surface but having the substrate subtended between the rollers opposite said surface forming said bights loosely.

19. The apparatus as claimed in claim 18 in which one of said rollers is mounted for applying continuous pressure against said drum and means is provided for biasing the other to overdrive to maintain tension on the portion of said substrate engaging said drum surface.

20. Apparatus for depositing a thin film on a length of substrate which comprises: a supply of substrate to be coated, means for accumulating coated substrate length, a pressure vessel having means therein for establishing a plasma vapor deposition condition within the vessel, structure disposed within the vessel and arranged to guide the substrate length from the supply to the accumulating means in a configuration establishing a tortuous path for substantially lengthwise movement of said substrate length and the said path being such as repeatedly to expose one surface of said substrate length to the depositing condition while said substrate length is in said tortuous path, said tortuous path comprising a series of convolutions and said structure comprising a drum having at least a substantial portion of each convolution engaging the exterior surface thereof, means for rotating said drum and carrying said convolutions circumferentially of the drum to move the same axially along the length of said drum, said means for moving the convolutions axially along the length of the drum comprising convolution shifting means, said convolutions forming a helix along the length of said drum and comprising a series of parallel turns arranged along said length and said convolution shifting means comprising structure for forming a cross-connecting loosely hanging bight between successive turns at the bottom ends thereof, said structure additionally including target means of arcuate configuration generally coaxial and telescopic of said drum and spaced outwardly thereof to form an annular plasma vapor gap between the said target means and the outer surfaces of said convolutions and substantially coextensive in area with the portion of the drum adapted to be occupied by said turns and open at least opposite the locations of said bights.

21. The apparatus as claimed in claim 20 in which said target means comprise a plurality of arcuate members at least some of which are circumferentially spaced apart and having means for individually adjusting the respective members.

22. Apparatus for depositing a thin film on a length of flexible substrate which comprises:
A. a pressure vessel including an enclosing side wall and enclosing end walls and means for establishing a sputtering plasma condition within the vessel and including
   i. anode means in the form of a rotary drum mounted on one end wall for rotation on a shaft defining an axis passing through both end walls,
   ii. cathode means comprising a plurality of targets on the interior of the vessel secured to the side wall and each target having a planar surface of the material to be sputtered which faces the exterior surface of the drum and is spaced therefrom, the targets being circumferentially spaced around the periphery of the drum and said planar surfaces generally defining at least part of a cylindrical surface that is coaxial with but larger in diameter than the drum whereby to form a plurality of consecutive arcuate gaps within which the sputtering plasma is adapted to be established, and
   iii. a high voltage source connected in a circuit which includes the anode means and the cathode means, the cathode means being at a substantially high negative voltage with respect to the anode means,
B. a supply of flexible substrate to be coated, arranged in a reel form and the substrate adapted to be stripped off from the reel and pass through said gaps,
C. take-up means for accumulating coated substrate in reel form,
D. means disposed within the vessel and cooperating with the drum to cause movement of the substrate while passing within the vessel from the supply to the take-up means in a tortuous path, said tortuous path including at least a portion of a circular turn around the drum with the substrate tightly engaged against the surface of the drum,
E. the said path being such as repeatedly to expose only the outer surface of the substrate to the sputtering plasma condition of respective gaps by guiding said substrate through said gaps while so engaged against the drum.

23. The apparatus as claimed in claim 22 in which the tortuous path includes more than a circular turn around the drum whereby the outer surface of the substrate will be subjected to the sputtering plasma condition of the respective gaps more than one time each.

24. The apparatus as claimed in claim 22 in which the enclosing side wall is of metal and the targets are insulated from the latter enclosing wall.

25. The apparatus as claimed in claim 22 in which the anode is at ground potential.

26. The apparatus as claimed in claim 22 in which the anode is negative with respect to ground.

27. The apparatus as claimed in claim 22 in which the cathode planar surfaces are arcuate.

28. The apparatus as claimed in claim 22 in which the supply and take-up means are both on the interior of the vessel.

29. The apparatus as claimed in claim 22 in which means are provided to control the temperature of the substrate by controlling the temperature of the surface of the drum.

30. The apparatus as claimed in claim 22 in which means are provided in the drum adjacent the surface thereof for controlling the temperature of the surface of the drum.

31. The apparatus as claimed in claim 22 in which first heat exchange liquid conduit means are provided in the drum adjacent the surface thereof for controlling the temperature of the surface of the drum, said drum having second heat exchange liquid conduit means connected with said first heat exchange liquid conduit means and extending through said drum shaft to the exterior of said vessel and adapted to be coupled to an external source of heat exchange liquid, the arrangement being such as to provide for circulation of said liquid through said conduits while the coating is being carried out.

32. The apparatus as claimed in claim 22 in which there are means for individually adjusting the gap of each target by moving the target radially relative to the drum.

33. The apparatus as claimed in claim 22 in which means are provided for cooling the targets comprising coolant conduits in the targets and means for extending passageways for carrying liquid coolants to and from the targets through the side enclosing wall and said passageways being coupled to a source of such coolant exterior of the vessel.

34. The apparatus as claimed in claim 23 in which there are means to transfer the substrate in axial direction along the surface of the drum while said substrate is being laid onto such surface at one axial end of the turns and being stripped off at the other axial end of the turns.

35. The apparatus as claimed in claim 34 in which the transfer means comprise turn shifting means.

36. The apparatus as claimed in claim 34 in which the transfer means comprise structure for forming a cross-connecting bight at the bottom of the drum between respective adjacent turns.

* * * * *